(12) United States Patent
Myers et al.

(10) Patent No.: US 7,974,044 A0
(45) Date of Patent: Jul. 5, 2011

(54) SOLDER CONTROL FEATURES FOR A DISC DRIVE HEAD FLEX INTERCONNECT

(75) Inventors: Gregory Paul Myers, Edina, MN (US); Adam Karl Himes, Richfield, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/491,098

(22) Filed: Jan. 25, 2000

Related U.S. Application Data

(60) Provisional application No. 60/117,792, filed on Jan. 29, 1999.

(51) Int. Cl.
G11B 5/48 (2006.01)
H05K 1/18 (2006.01)
(52) U.S. Cl. ........................................ 360/245.9; 439/83
(58) Field of Classification Search ............... 360/245.9, 360/246, 244.1; 439/83; 361/743
See application file for complete search history.

(56) References Cited

U.S. PATENT DOCUMENTS

| | | | | |
|---|---|---|---|---|
| 5,270,673 A | * | 12/1993 | Fries et al. | .................... 333/246 |
| 6,046,886 A | | 4/2000 | Himes et al. | |

* cited by examiner

*Primary Examiner* — George Letscher
(74) *Attorney, Agent, or Firm* — Mikel Boeve; Jennifer Buenzow

(57) ABSTRACT

A FOS circuit and a method for fabricating the same that reduces the possibilities of shorts or damage to a circuit board during assembly due to solder reflow. The FOS circuit has a tail, a shunt bar, a plurality of flying leads, and a dam. The tail has a first and second end. The shunt bar is located adjacent to the second end of the tail. The plurality of flying leads project substantially perpendicular from the first edge of the second end of the tail. The plurality of flying leads are substantially parallel to one another and extend between the second end of the tail and the shunt bar. A plurality of electrical paths are formed through the tail to the flying leads. The dam intersects the flying leads and extends from a first flying lead to a last flying lead and is substantially parallel with the first edge of the second end of the tail.

10 Claims, 6 Drawing Sheets

SOLDER CONTROL FEATURES FOR A DISC DRIVE HEAD FLEX INTERCONNECT

RELATED APPLICATIONS

This application claims the benefit of provisional application Ser. No. 60/117,792 (Seagate No. 9029) entitled "Solder Control Features For A Disc Drive Head Flex Interconnect" filed on Jan. 29, 1999.

FIELD OF THE INVENTION

The present invention relates to flex on suspension (FOS) circuits, and more particularly to an improved design of a FOS circuit.

BACKGROUND OF THE INVENTION

Disc drive systems are well-known. They include data heads including transducer elements for reading or writing data to a recordable disc. Transducer elements of the data heads are electrically coupled to the main drive circuitry through a head interconnect circuit. Conductive paths on the head interconnect circuit electrically couple head leads coupled to transducer elements on the head to circuit leads connected to drive circuitry.

Heads are supported relative to a disc surface by a head actuator. A drive circuit is mounted on the head actuator and circuit leads on the head interconnect circuit are coupled to lead connectors or solder pads on the drive circuit via a flex on suspension (FOS) circuit. Leads are supported along an edge of a lead tip of the head interconnect circuit and connectors or solder pads are aligned along a slot or edge of the drive circuit. The lead tip is inserted into the slot or aligned with the edge to couple the circuit leads to connectors. Leads are soldered to connectors to electrically connect transducer elements of the head to main drive circuitry.

Prior to soldering, leads are aligned with the connectors or solder pads to assure desired electroconnection for read and write operations. Drive circuits on a head actuator include a conductive metal substrate supporting a printed circuit. During the soldering operation, solder can wick from the solder pad or connector to surrounding features. Solder that wicks to a metal substrate can short the electroconnection between the data heads and drive circuitry making the data heads defective. Similarly, solder can bridge from the solder pads to the shunt bar. The shunt bar is removed from the FOS circuit during assembly and after the flying leads are soldered to the solder pads. If solder attaches to the shunt bar, extra force is required to remove it. This can result in the surface of the printed circuit delaminating and result in a defective circuit. The present invention addresses these and other problems, and offers other advantages over the prior art.

SUMMARY OF THE INVENTION

In one aspect of the invention, a dam is fabricated coupled to the flying leads of the FOS circuit. The flying leads project from a tail in a roughly perpendicular direction to a first edge of the tail. The dam spans the flying leads substantially parallel to the edge of the tail. The dam restricts solder flow during the solder reflow process in which the flying leads are soldered to the printed circuit card (PCC) of a disc drive circuitry.

In another aspect of the invention, two dams are fabricated coupled to the flying leads of the FOS circuit. The additional dam further restricts solder travel during the solder reflow process in which the FOS circuit flying leads are soldered to the solder pads of the PCC.

In another aspect of the invention, a non-metallic substrate is coated with conductive layer. A mask is deposited on the conductive layer defining the FOS circuit. Also included in the mask is a dam which intersects a plurality of flying leads of the circuit. The mask is then developed and etched such that a FOS circuit is formed with a dam.

In another aspect of the invention, a non-metallic substrate material is coated with a conductive layer. A mask is deposited on the conductive layer to define a FOS circuit and also a plurality of dams intersecting a plurality of flying leads on the circuit. The mask is then developed and etched to form a FOS circuit with a plurality of dams.

DETAILED DESCRIPTION OF THE PREFERRED EMBODIMENTS

A FOS circuit, or FOS, is used to interconnect between the read-write head of a disc drive and the main control circuitry of the disc drive. One of the steps in the assembly is connecting the FOS to the data flex circuit, also known as the PCC, by a solder reflow process. The solder used to make the interconnect between the FOS and the data flex circuit is not well controlled during the reflow process. Because of this solder can wick onto a shunt bar, which is in a region which is supposed to be compliant thereby making it non-compliant. This also makes the shunt bar more difficult to remove, thus increasing the time required in assembling the FOS. In addition, the PCC may delaminate during removal of the shunt bar resulting in defective heads. To compensate for solder bridging between the solder pads and the shunt bar, shunt removal can be facilitated by making the FOS leads narrower at the tear off location. However, this leads to a more fragile circuit and decreases yield during manufacturing processes.

Solder shorts are also caused between the flying leads and the PCC stiffener. The PCC stiffener is used to make the PCC more rigid. The PCC stiffener is usually made from a electrically conductive material such as aluminum. Because the PCC stiffener is conductive, if solder bridges the gap between the flying leads and the PCC stiffener, a short is caused making the head defective.

One way to control the shorting is by restricting the volume of solder which will reflow during the solder reflow process. Similarly, the tip of the solder reflow instrument impacts the travel of the solder during the assembly process and varying the design can help reduce defects caused by uncontrolled solder flow. However, neither of these methods provide an absolute restriction on solder travel. Other methods that impact the defects due to unrestricted solder travel may be used, although in the existing methods there is no absolute restriction on solder flow.

The present invention reduces the disadvantages associated with solder flow by providing a FOS with a unique design. More particularly, the present invention provides a means to physically limit solder flow during reflow soldering. A dam is pattered in the cover coat and/or the polyimide base on either side of the FOS leads. The dam provides a physical barrier which limits the flow of solder during the reflow process, thereby reducing the possibility of shorts because of solder bridging between the leads and the PCC stiffener and allowing the FOS leads to be made broader, thereby increasing the strength at the tear off location of the shunt.

Figure 1:
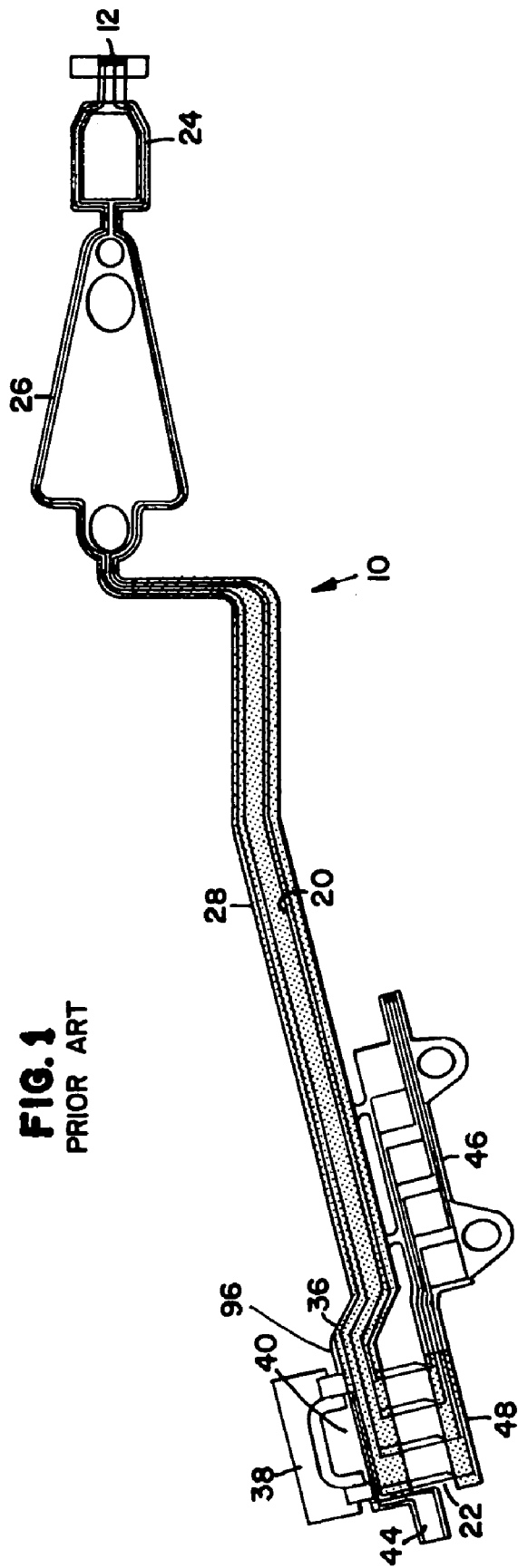
FIG. 1 is a plan view of a prior art FOS circuit.

As way of background, FIG. 1 is a plan view of a flex on suspension (FOS) 10 circuit according to the prior art. The FOS 10 circuit includes a head gimbel 24 region, a load beam 26, a tail 28, flying leads 22 and a shunt bar 48. The tail 28 has a first end 34 and a second end 36. The second end 36 comprises a first edge 74, a second edge 94, and a third edge 96. The third edge 96 is located opposite the first edge 74. The FOS 10 may also contain a loopback 46, a flapper 38, a shark fin 40 and a foot 44. The head leads 12 are connected to the read-write components of a disc drive assembly. Signals are passed back and forth from the read-write head through the FOS 10 circuit. An electrical connection path 20 is formed between the head leads 12 and the flying leads 22 running from the head leads 12 through the head gimbel 24 region through the load beam 26 and the along the tail 28 to the flying leads 22. The FOS 10 is used to make the connection between the read-write heads and the main circuitry of a disc drive.

The second end 36 of the tail 28 may also contains structural elements which assist the FOS 10 in staying in place. The flapper 38 prevents one FOS 10 from shorting to another. The flapper 38 is located on the third edge 96 of the tail 28. During the manufacturing process, the flapper 38 is folded up to protect the flying leads 22. The shark fin 40 adds depth to the FOS 10 engagement during the manufacturing process. The shark fin 40 is located on the third edge 96 of the tail 28. The shark fin 40 also helps to hold the FOS 10 in place. The foot 44 helps to hold the FOS 10 in place. The foot 44 is designed so that it does not allow the FOS 10 to sag after final assembly. The foot is located on the second edge 94 of the tail 28. The loopback 46 contains circuitry which is electrically continuous with the electrical connection paths 20 from the head leads 12 through the flying leads 22. The loopback 46 is used for testing electrocontinuity of the electrical connection paths 20 during the manufacturing process. The shunt bar 48 is also a part of the loopback 46 and is used to assist placement of the flying leads 22 to be welded during the solder reflow process. The shunt bar 48 is removed after the electrocontinuity tests are performed.

Figure 2:
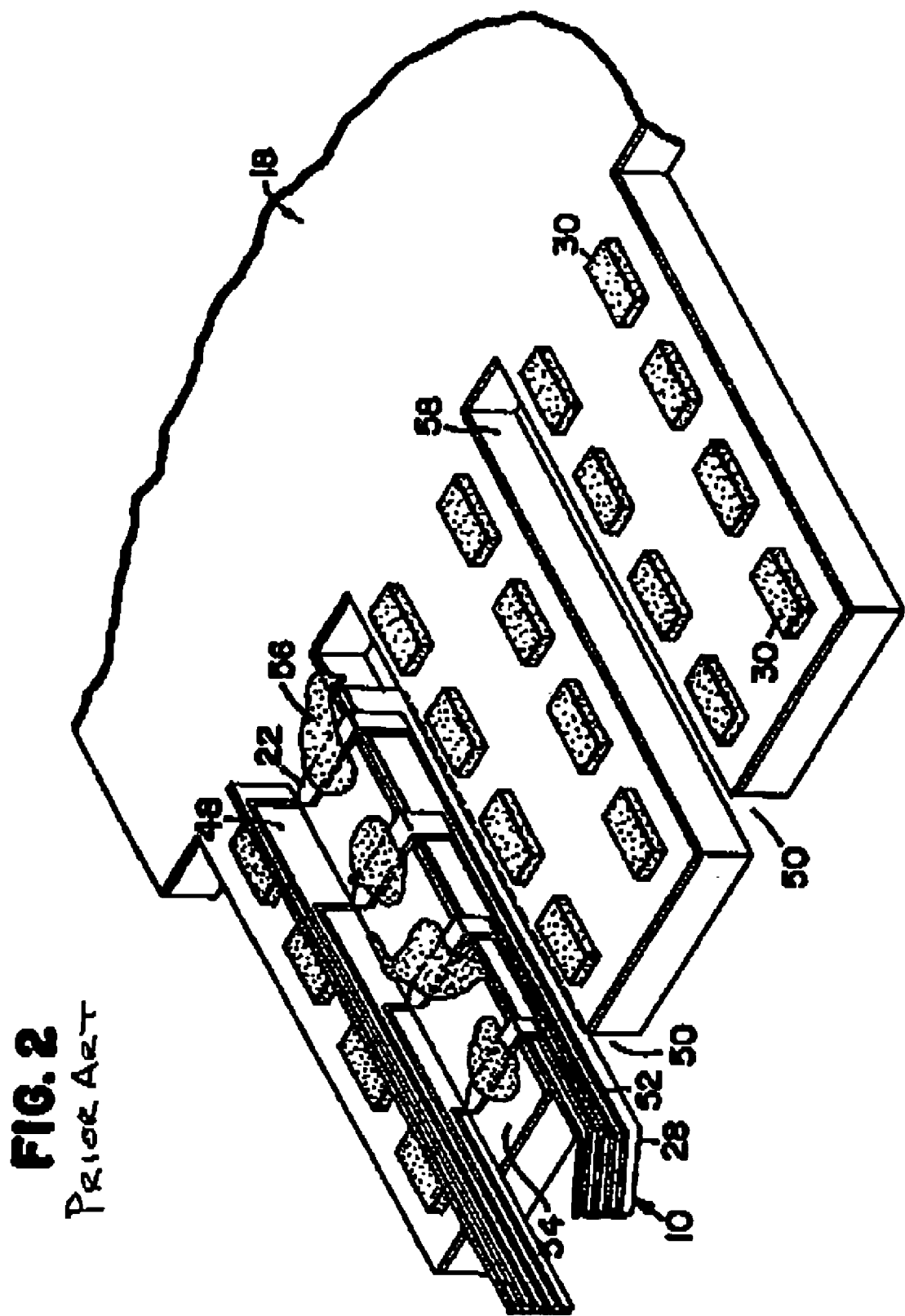
FIG. 2 is a perspective view of a FOS circuit shown in FIG. 1 coupled to a PCC.

FIG. 2 is a perspective view of a FOS 10 circuit shown in FIG. 1 coupled to a PCC 18. The tail 28 is inserted into the slot 50 with the circuit leads 52 facing away from the surface 54 of the tail 28 which contacts the PCC 18. The flying leads 22 are folded over onto the surface 54 of the PCC 18 such that each flying lead 22 is positioned substantially over a solder pad 30. The shunt bar 48 extends substantially perpendicular from the surface 54 of the PCC 18.

Because there is no physical constraint on the flow of the solder 56 as it is melted during the solder reflow process, it can wick and contact the PCC 18 stiffener 58, causing a short. This short results in a defective head assembly. The reflowed solder 56 can also wick into contact with the shunt bar 48. The solder 56 that contacts the shunt bar 48 can also bond to the surface 54 of the PCC 18. After the flying leads 22 are positioned, the shunt bar 48 is removed during final assembly. In areas where the solder 56 forms a bridge between the shunt bar 48 and the surface 54 of the PCC 18, the surface 54 of the PCC 18 can delaminate when the shunt bar 48 is torn off during final assembly. The result is a defective head assembly. Shorts due to solder 56 bridging between the flying leads 22 and the stiffener 58 of the PCC 18 and lift-off of the surface 54 of the PCC 18 during shunt bar 48 tear off are the two main sources of yield reduction due to the solder reflow process.

Figure 3:
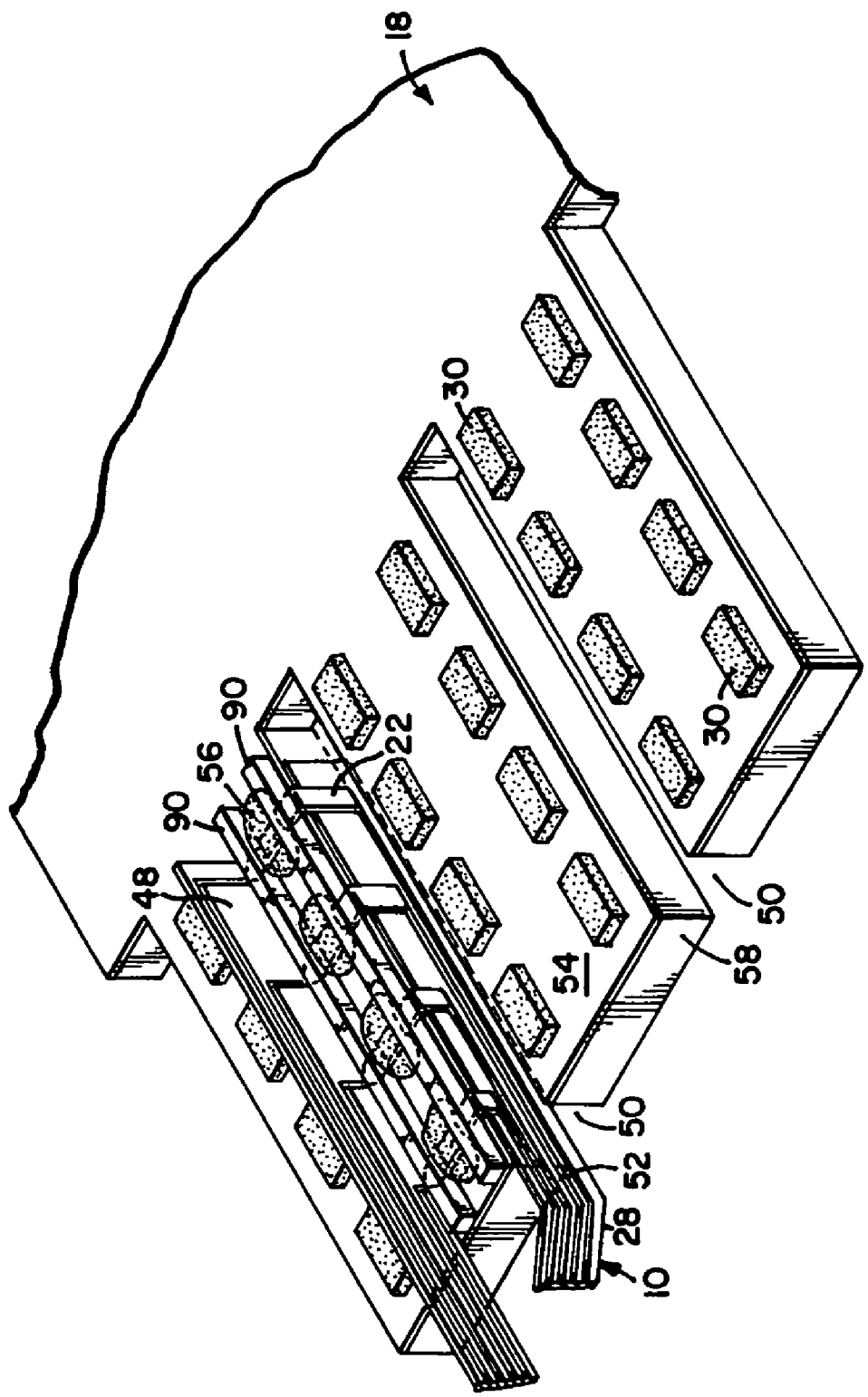
FIG. 3 is a perspective view of a FOS circuit according to a preferred embodiment of the present invention coupled to a PCC.

FIG. 3 is a perspective view of a FOS 10 circuit according to a preferred embodiment of the present invention coupled to a PCC 18. In the preferred embodiment of the present invention, a dam 90 is fabricated as part of the FOS 10 during the manufacturing process. Subsequently in the manufacturing process, the tail 28 is inserted into the PCC 18 slot 50 oriented so the electrical connection path 20 is oriented on the surface 54 of the tail 28 located away from the tail's 28 point of contact with the PCC 18. The dams 90 restrict the solder 56, which flows during the solder reflow process, by physically limiting where the solder 56 can flow. The dams 90 can be located on either surface 54 of the flying leads 22. The dams 90 on the surface 54 of the flying leads 22 positioned between the flying lead and the surface 54 of the PCC 18 are formed from the polyimide substrate from which the FOS 10 circuit is fabricated. The dams 90 on the opposite surface 54 of the flying leads 22 are integrated into the cover coat pattern during fabrication. It can be seen that during the solder reflow process the dams 90 physically constrain the travel of solder 56 that is melted during the solder reflow step in the manufacturing process. Because of the physical restrictions on flow, solder 56 does not flow into the shunt bar 48 area, and bridging between the shunt bar 48 and the PCC 18 surface 54 is eliminated. Similarly, the dams 90 between the PCC 18 slot 50 and the solder pads 30 physically inhibit the solder 56 from flowing and bridging between the flying leads 22 and the PCC 18 stiffener 58, thereby reducing or eliminating shorts.

Figure 4:
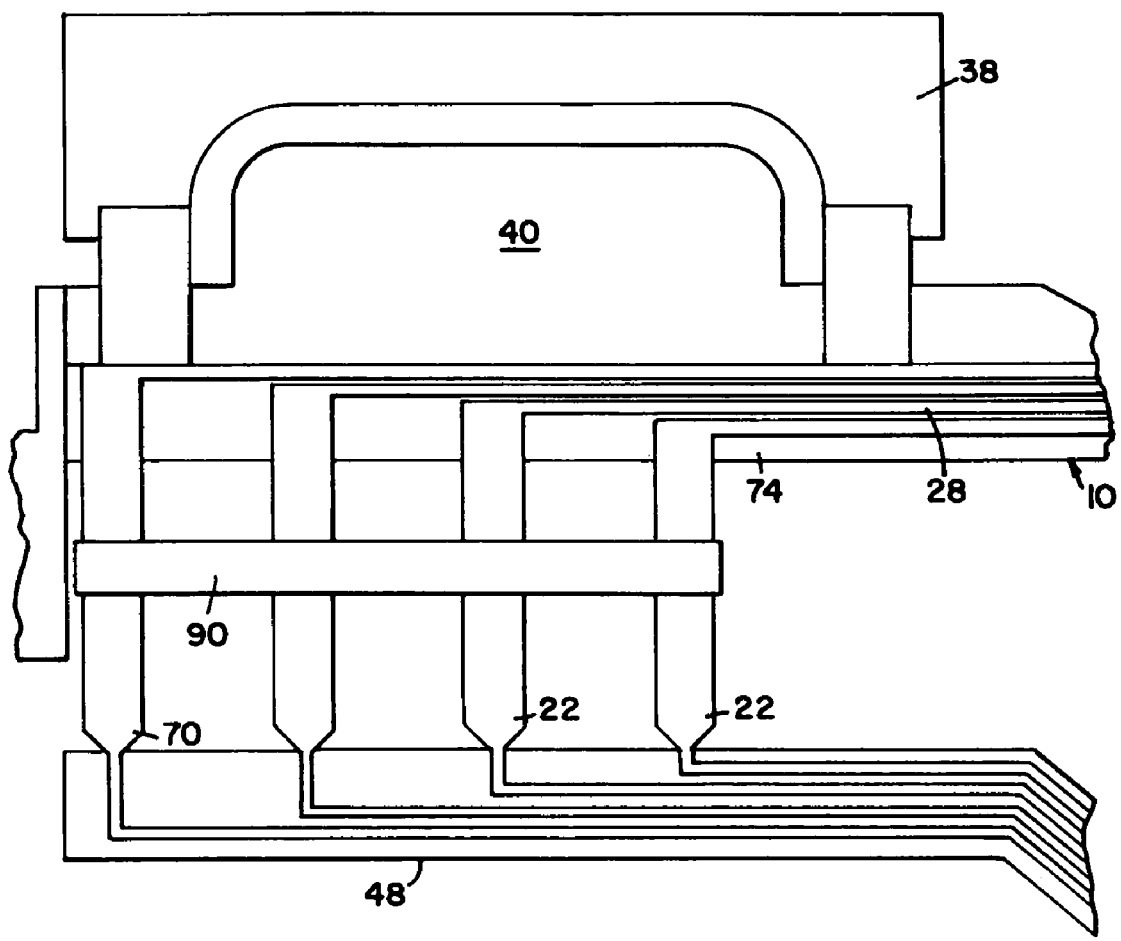
FIG. 4 is a plan view of the flying lead region of a FOS circuit shown in FIG. 3.

FIG. 4 is a plan view of the flying lead region of the FOS circuit shown in FIG. 3. The dam 90 spans the flying leads 22 from a first 70 flying lead 22 to a last 72 flying lead 22 wherein the last 72 flying lead 22 is located most distant from the first 70 flying lead 22. The flying leads 22 extend from a first edge 74 of the tail 28 in a substantially perpendicular orientation with respect to the first edge 74. The flying leads 22 are also connected to the shunt bar 48. The dam 90 is patterned on the FOS 10 circuit during the imaging process whereby the features of the FOS 10 circuit are formed. The dam 90 spans the flying leads 22 with its long edge roughly parallel to the first edge 74 of the second end 36 of the tail 28. The FOS 10 circuit also contains a flapper 38 which prevents one FOS 10 from shorting to another. The FOS 10 may also contain a shark fin 40.

Figure 5:
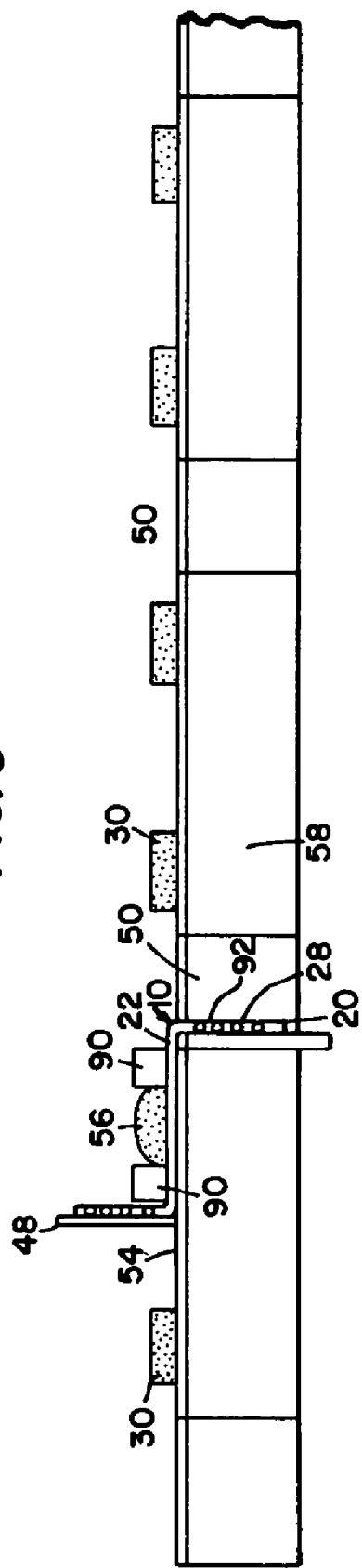
FIG. 5 is a front view of a FOS circuit shown in FIG. 3 coupled to a PCC.

FIG. 5 shows a front view of a FOS 10 circuit embodying the current invention as coupled with the PCC 18. The tail 28 is positioned into a slot 50 on the PCC 18. The PCC 18 also has a stiffener 58 to increase its rigidity. The stiffener 58 is usually made from a conductive material. The surface 92 of the tail 28 containing the electrical connection path 20 is placed away from the surface 54 of the PCC 18 and PCC 18 stiffener 58. After the tail 28 is positioned into a PCC 18 slot 50, the flying leads 22 are folded over such that the flying leads 22 are in contact with the solder pads 30. The shunt bar 48 extends roughly perpendicular from the surface 54 of the PCC 18 during this step and keeps the flying leads 22 in place during the solder reflow process. The electroconnection between the flying leads 22 and the solder pads 30 is then accomplished by having a solder reflow head pass over the solder pads 30, thereby melting or reflowing the solder pads 30. After the solder head reflows the solder 56, it passes from the area allowing the solder 56 to cool. Upon cooling, a continuous electrical connection is made between the solder pads 30 and the flying leads 22. During the solder reflow process the dam 90 physically restricts the melted solder 56 from flowing over the surface 54 of the PCC 18 card and down into the slot 50. Shorts due to solder 56 bridging between the solder pad 30 and the PCC 18 stiffener 58 are eliminated because solder 56 cannot physically pass the dam 90. Similarly a dam 90 positioned between the shunt bar 48 and the solder pads 30 physically restricts the solder 56 from flowing to the shunt bar 48. Because excess solder 56 does not attach, the shunt bar 48 is more easily removed during tear off. Delamination of the surface 54 of the PCC 18 is reduced or eliminated.

Figure 6:
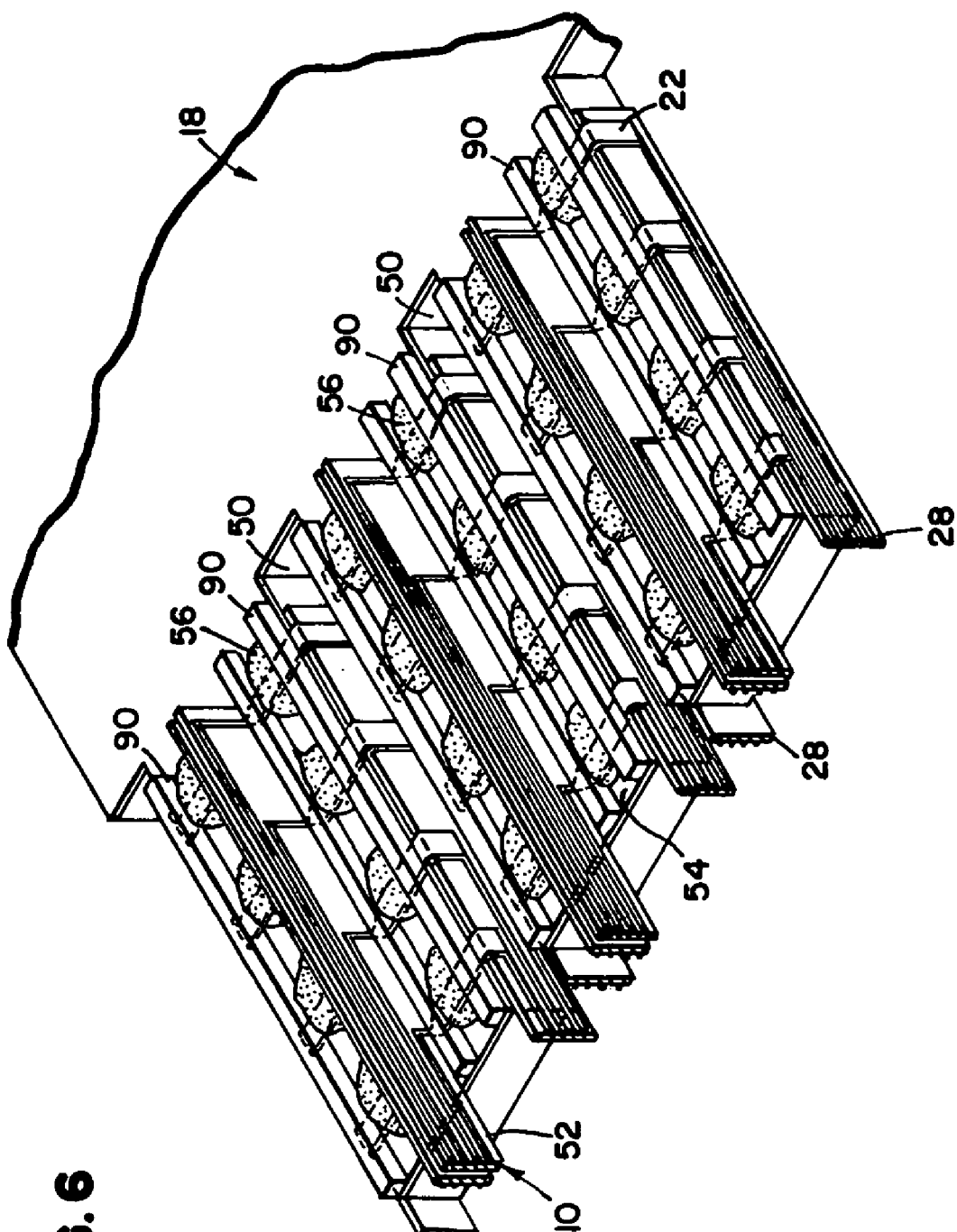
FIG. 6 is a perspective view of a plurality of FOS circuits circuit according to a preferred embodiment of the present invention coupled to a PCC.

FIG. 6 is a perspective view of a plurality of FOS 10 circuits according to a preferred embodiment of the present invention coupled to a PCC 18. The tail 28 is placed into the slot 50 of the PCC 18 and the PCC 18 stiffener 58. The flying leads 22 are folded over so that the flying leads 22 rest upon the solder pads 30 located on the surface 54 of the PCC 18. The shunt bar 48 extends substantially perpendicular from the surface 54 of the PCC 18 and helps locate the flying leads 22 over the solder pads 30 during the solder reflow process. The solder reflow mechanism is passed over the solder pads 30, which are melted. As a result of the solder reflow process, the flying leads 22 are immersed or surrounded by the molten solder 56. Without the darns 90 there is no restriction on the flow of solder 56 during this process. It may only be controlled by restrictions on solder 56 volume or other design tradeoffs. As was discussed previously, there are inherent disadvantages to these approaches. Without the darns 90 in place, solder 56 from the solder pads 30 may flow into the slot 50 on the PCC 18 and connect with the PCC 18 stiffener 58 thereby causing a short resulting in a defective apparatus. Similarly, solder 56 from the solder pad 30 can flow to the shunt bar 48, thereby increasing the amount of force needed to tear off the shunt bar 48 after the flying leads 22 are welded into position. The darns 90 provide a physical barrier to the flow of solder 56 during the solder reflow process thereby eliminating shorts caused by bridging of the solder 56 between the flying leads 22 and the PCC 18 stiffener 58. Defects due to delaminating of the PCC 18 surface 54 are also reduced because the shunt bar 48 can be torn off with less force than required if there is a solder 56 bridge is between solder pads 30 and the shunt bar 48.

The above specification provides a complete description of the invention. Since many embodiments of the invention can be made without departing from the spirit and scope of the invention, the invention resides in the claims hereafter appended.

We claim:

1. A flex on suspension circuit comprising:
    a tail with a first and a second end;
    a shunt bar located adjacent to the second end of the tail;
    a plurality of flying leads projecting substantially perpendicular from a first edge of the second end of the tail wherein the plurality of flying leads are substantially parallel with one another and extend between the second end of the tail and the shunt bar;
    at least one solder pad associated with each flying lead; and
    a dam on opposing sides of each solder pad, each dam intersecting the flying leads, wherein each dam extends from a first flying lead to a last flying lead and is substantially parallel with the first edge of the second end of the tail.

2. The flex on suspension circuit of claim 1 further comprising a foot at the second end of the center tail route wherein the foot is located on a second edge of the second end of the tail.

3. The flex on suspension circuit of claim 1 further comprising a plurality of head leads wherein a continuous electrical path is formed between the head leads and the flying leads.

4. The flex on suspension circuit of claim 1 further comprising a gimbel region.

5. The flex on suspension circuit of claim 1 further comprising a load beam area coupled to the first end of the tail.

6. The flex on suspension circuit of claim 1 further comprising a loopback.

7. The flex on suspension circuit of claim 1 further comprising a flapper on a third edge of the second end of the tail wherein the third edge is located opposite the first edge.

8. The flex on suspension circuit of claim 1 further comprising a shark fin wherein the shark fin is located on a third edge of the second end of the tail wherein the third edge is located opposite the first edge.

9. The flex on suspension circuit of claim 1 wherein the dam is fabricated from a polyimide material.

10. The flex on suspension circuit of claim 1 wherein the dam is fabricated from a covercoat material.

* * * * *